United States Patent
Cardamone

(10) Patent No.: US 6,556,153 B1
(45) Date of Patent: Apr. 29, 2003

(54) SYSTEM AND METHOD FOR IMPROVING ENCODER RESOLUTION

(75) Inventor: Joseph M. Cardamone, Shirley, NY (US)

(73) Assignee: Anorad Corporation, Hauppauge, NY (US)

( * ) Notice: Subject to any disclaimer, the term of this patent is extended or adjusted under 35 U.S.C. 154(b) by 0 days.

(21) Appl. No.: 10/042,879

(22) Filed: Jan. 9, 2002

(51) Int. Cl.⁷ .............................................. H03M 1/22
(52) U.S. Cl. ...................................... 341/111; 341/115
(58) Field of Search ............................... 341/111, 112, 341/113, 114, 115, 116, 117

(56) References Cited

U.S. PATENT DOCUMENTS

| | | | | |
|---|---|---|---|---|
| 3,673,395 A | * | 6/1972 | Tripp | 341/111 |
| 4,511,884 A | * | 4/1985 | Serev et al. | 341/116 |
| 4,630,928 A | * | 12/1986 | Klinger et al. | 341/116 |
| 5,463,393 A | * | 10/1995 | Havlicsek | 341/115 |
| 5,706,219 A | | 1/1998 | Ishimoto | 364/724.1 |
| 6,051,971 A | | 4/2000 | Holden | 324/207.24 |
| 6,188,341 B1 | | 2/2001 | Taniguchi | 341/116 |

* cited by examiner

*Primary Examiner*—Howard L. Williams
(74) *Attorney, Agent, or Firm*—Himanshu S. Amin; John M. Miller; Alexander M. Gerasimow

(57) ABSTRACT

A system and method are disclosed for improving resolution of an encoder or other position sensing device that provides one or more signals indicative of relative movement between two bodies. The signals are employed to determine an operating mode, which varies as a function of relative speed between the two bodies. In one operating mode, the system determines an indication of position by interpolating between position information of a table. Position also can be predicted in this operating mode, which can be used to update the position information. The table is populated with position information based on a sample of the signals from the position sensing device, such as to provide the position information for the table. In another operating mode, an indication of position is determined as a function of velocity and time.

35 Claims, 11 Drawing Sheets

SYSTEM AND METHOD FOR IMPROVING ENCODER RESOLUTION

TECHNICAL FIELD

The present invention relates generally to position sensing and, more particularly, to a system and a method for improving resolution of an encoder.

BACKGROUND OF THE INVENTION

In order to control movement of a moving member, such as a rotary and/or linear actuator, it is often necessary to determine the position of the moving member relative to some frame of reference. The position can be derived as an absolute position or a relative position. The position information further can be employed to determine velocity and/or acceleration of the moving member. In some cases, velocity and/or acceleration are detected, from which desired position information is derived. The position and velocity information can be utilized to control movement of the moving member, including its travel distance, its speed, as well as other characteristics. The equipment and algorithms employed to make appropriate measurements and determine the position and/or velocity of the member usually vary depending on the environment in which the system is implemented and whether the movement of the member is rotational, such as in the case of a rotary motor, or whether movement of the member is generally linear, such as in linear motor.

For the example of a rotary motor, an encoder disk or a tachogenerator usually is secured to a rotor shaft so as to rotate with the shaft, such as during activation of the motor. An associated sensing device (e.g., optical and/or magnetic) monitors movement of the disk relative to a stator to provide an indication of the motor rotation. For a linear motor, a linear encoder scale (e.g., optical or magnetic) is arranged on a path along which a moveable stage can traverse. One or more sensors are arranged to monitor movement of the stage relative to the path based on detecting the encoder scale during relative movement between the stage and the path. The detected movement can be used to determine position and velocity of the respective motors, such as to facilitate control of the motor.

By way of further illustration, in one type of linear encoding apparatus, the sensing device is in the form of a readhead that includes a light source to illuminate a scale. Associated optical components cooperate with the scale to generate a periodic light pattern, which varies as a cyclic light intensity modulation based on relative movement of the scale and readhead. The readhead typically includes one or more photodetectors that detect modulated light intensity and emit corresponding electrical signals indicative of the light intensity modulation. The electrical signals are sent to a signal processing circuit that processes the signals to provide a pair of sinusoidally varying output signals, which may be in quadrature.

Devices of this type usually function in an incremental fashion. The output signals from the signal processing circuit serve as a basis for generating a total on a counter, indicative of the relative displacement of the scale and readhead. The total on the counter can be augmented or reduced based on the number of output signal cycles received, and the order in which these signals arrive at the counter. Additionally, to provide an increased level of resolution, interpolation can be performed relative to the output signals. Such interpolation, for example, can involve taking a ratio of the output signals from the encoder so as to compute a tangent of the angle.

In most conventional systems that employ interpolation to improve encoder resolution, such increased resolution is usually limited as a function of the speed of the moving bodies. Further, as the encoder is subject to environmental stress, such as temperature fluctuations, as well as other mechanical and electrical variables, the accuracy of most conventional systems can be compromised, especially at higher resolutions. Because most such systems also employ functional calculations to determine the interpolated position information, signal errors from the encoder signals can perpetuate through the calculations, which can result in additional inaccuracies in the computed position.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the present invention provides a system to help improve resolution of an encoder or other position sensor, which provides one or more signals indicative of relative movement between a pair of bodies (e.g., moveable parts of a linear or rotary motor). A velocity module is operative to determine a relative velocity between the bodies based on received encoder information. A low speed position module is operative to determine an indication of relative position between the moving bodies based on data stored in a position table when the system is in operating in a first mode. The operating mode is determined based on the relative velocity. The position table is populated with position data based on at least some of the received encoder information. In a particular aspect of the present invention, the encoder information can be provided as quadrature signals, with the table being populated with position data obtained between zero crossings for one or more of the quadrature signals. The system also includes a high velocity position module that is operative to provide an indication of relative position between the moving bodies as a function of the relative velocity when the system is operating in a second mode.

Another aspect of the present invention provides a method of improving encoder resolution. The method includes determining an indication of a relative velocity between the two bodies and operating between at least two different modes based on the relative velocity. A lookup table is populated based on a plurality of samples of the encoder signal obtained over a known distance. An indication of relative position between the two bodies based on position data stored in the lookup table is determined in a first of the modes. An indication of relative position between the two bodies based on the relative velocity between the two bodies is determined when in a second of the modes.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention provides a system and method for improving resolution of a position sensing device. The position sensing device provides one or more position signals as a function of relative movement between first and second members. The position signals are employed to determine an operating mode, which varies as a function of speed. In one operating mode, the system determines an indication of incremental position by interpolating between position information from a table. The table is dynamically populated with position information based on digitized position signals from the position sensing device, such as to provide a high-resolution incremental position value. In another operating mode, an incremental position is determined as a function of velocity and time relative to previous position information. The incremental position is employed to increment a position counter that provides an indication of the position at a desired high resolution.

Figure 1:
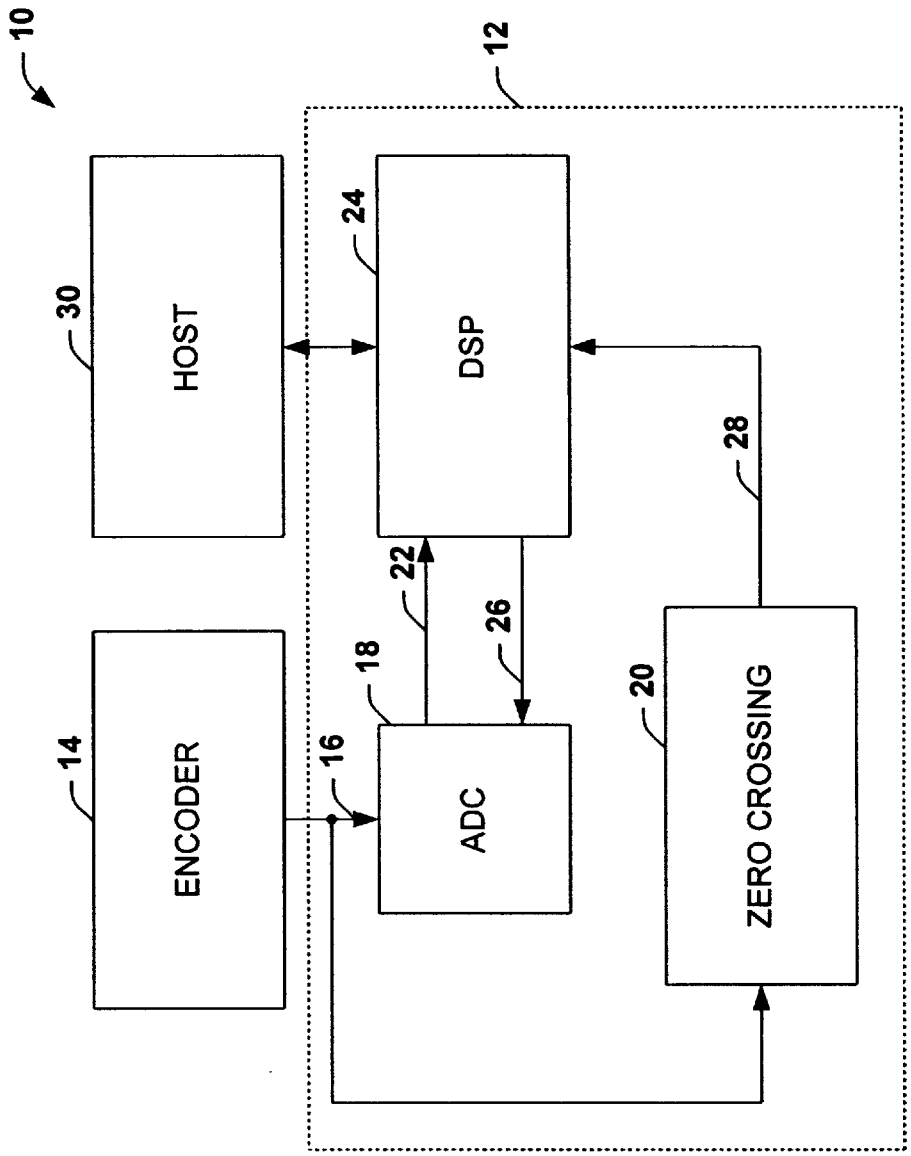
FIG. 1 is a functional block diagram of a system for improving encoder resolution in accordance with an aspect of the present invention.

FIG. 1 illustrates a functional block diagram of a position sensing system 10 in accordance with an aspect of the present invention. In particular, the position sensing system 10 includes a subsystem 12 that can be implemented to improve resolution of an encoder 14 in accordance with an aspect of the present invention. The encoder 14 includes one or more sensors to provide one or more encoder output signals 16 to one or more associated analog-to-digital converters (ADCs) 18 and to a zero crossing detector 20 of the subsystem 12. It is to be appreciated that one or more filters also can be employed to filter the analog encoder signals 20, such as to mitigate noise and extraneous data associated with the respective output signals.

The encoder 14, for example, can include optical and/or magnetic sensors that provide corresponding output signals 16 having a quadrature relationship, such as sine and cosine signals. The optical and/or magnetic sensors of the encoder 14 provide the respective output signals 16 based on detecting respective changes in optical or magnetic characteristics resulting from relative movement between two bodies.

The ADC 18 is configured to convert each of the encoder output signals into corresponding digital signals 22 that are provided to a Digital Signal Processor (DSP) 24. For example, an ADC 18 can be provided for each output signal 16, although the signals could be multiplexed and converted through a single ADC. The digitization of the encoder signals 16 can implement high-speed discrete time sampling of the analog encoder signals so as to provide high resolution digital conversion, such as a fifteen bit word for each sample.

The ADC 18 further can implement offset and/or gain adjustment of the digitized signals, such as based on feedback control signals 26 from the DSP 24. For example offset adjustments can be made to center the digitized encoder output signals 22 relative to a halfscale voltage or current value. If the maximum and minimum values of each digitized encoder signal are not centered about an expected halfscale value, an appropriate offset can be applied to each respective digitized signal. Similarly, if the maximum and minimum values (e.g., peak-to-peak) of each digitized signal 22 is not at desired maximum and minimum values, the DSP 24 can provide feedback 26 to adjust the gain of the ADC 18 accordingly. The offset and gain control thus help scale the input signals so as to facilitate providing a desired high resolution position.

The zero crossing detector 20 provides an output signal 28 to the DSP 24 in response to detecting zero crossings in the analog encoder output signals 16. For example, zero crossings can be detected for each of the encoder output signals 16, one of the encoder output signals, or a combination of two or more of the encoder output signals. Each zero crossing (or peak) in the encoder signal 16 generally corresponds to a particular magnetic or optical property that occurs at a known position detectable by the encoder 14 according to relative movement between two bodies.

The DSP 24 employs the digitized encoder signal(s) 22 and the zero crossing signal(s) 28 to determine a high resolution position in accordance with an aspect of the present invention. The DSP 24 provides the position information, which is provided to a host 30, such as a motor controller, a computer or other device that might utilize the position information. The DSP 24 also can drive a Digital-to-Analog Converter (DAC) (not shown) so that a corresponding analog signal is provided based on the multi-bit output from the DSP.

By way of example, the DSP 24 is programmed and/or configured to operate in two or more different modes for computing an indication of position. The DSP 24 operates in the different modes based on a relative velocity between the moving bodies, which is determined based on the zero crossing signal 28 derived from the encoder output signal(s) 16. The velocity can be determined based on the time between zero crossings. For example, the distance between respective markings is known and zero crossings in the encoder data signals occur at each such marking. Accordingly, a simple mathematical operation (distance divided by time) yields the velocity, in which the only variable is the time between zero crossings. The time can be easily derived from an internal count that occurs between the zero crossings.

In accordance with an aspect of the present invention, the DSP 24 can operate in a low velocity mode, such as when the magnitude of the velocity is below of low velocity threshold $V_{low}$. In the low velocity mode, position information is determined from a lookup table of position values for the digitized encoder signals, such as sine and cosine quadrature signals. The lookup table can be populated with the digitized sine and cosine data while in the low velocity mode, although it also could be populated during other operating modes (e.g., a high speed mode, a calibration mode, etc.).

As mentioned above, the DSP also operates in a high velocity mode for determining position information. For example, the high velocity mode operates under the assumption that for speeds greater than a high velocity threshold $V_{high}$, the velocity between zero crossings does not significantly change. As a result, at high speeds (e.g., above a predetermined $V_{high}$), the position can be obtained as a function of an actual velocity, the current time and the previous position (position=velocity*time+previous position). The DSP can readily determine the velocity by determining the number of timer counts between zero crossings. The accuracy of the velocity determination can be improved by employing a relatively fast timer, such as 200 MHz or faster. In order to get the position to a desired word size, the position information can be multiplied by an appropriate multiplication factor. For example, to obtain a 15 bit position value, the computed incremental position can be multiplied by 32768. Further, a predetermined number of most significant bits from a previous position can be added to the computed 15 bit position, such as to provide a desired high resolution position. Continuing with the example of a 15 bit incremental position, 17 MSB from the previous position can be aggregated with the computed 15 bits to provide a 32 bit position. Those skilled in the art will understand and appreciate that other numbers of bits can be utilized in accordance with an aspect of the present invention.

Figure 2:
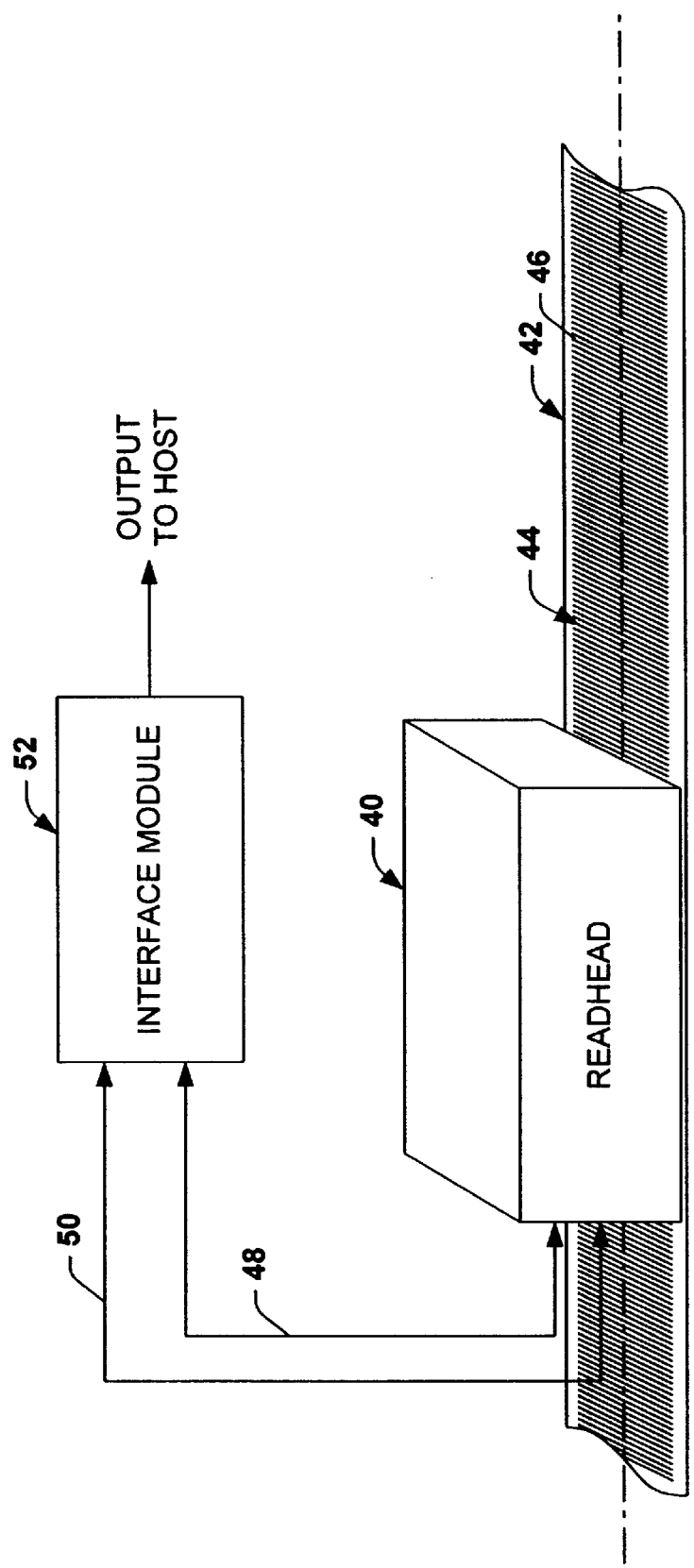
FIG. 2 is an example of an encoder system coupled to an interface module for improving encoder resolution in accordance with an aspect of the present invention.

FIG. 2 illustrates a readhead 40 that is moveable along a stationary path 42 and operative to detect variations in a pattern 44 disposed along the path, such as on a length of tape 46. For example, the pattern 44 can have optical and/or magnetic properties that vary along the path length. While the portion of the path 42 illustrated in FIG. 2 is shown as being substantially linear, it is to be appreciated that any shape path (e.g., curved, rotary, curvilinear, etc.) can be employed in accordance with an aspect of the present invention. More generally, it is to be appreciated that the interpolation system (FIG. 1) is not restricted for use with a readhead that moves relative to a path, as it is applicable to any type of position sensing device for which an improved resolution may be desired.

By way of illustration, the tape 46 can be arranged along the path 42 such that one or more optical encoder sensors can detect changes in the optical characteristics of the tape as the readhead 40 moves along the path. The pattern 44, for example, includes fine parallel lines (e.g., reflective and/or opaque), which can have a constant thickness or vary along its length. The readhead 40 includes an optical encoder sensor (not shown) that focuses one or more beams of light on encoder tape, and detects the changes in light reflected therefrom as pattern changes with relative movement along the path. Generally, optical encoder sensor provides output signals 48 and 50 to an interface module 52. The output signals 48 and 50 have a quadrature relationship (e.g., sine and cosine signals). The interface module 52 employs the signals 48 and 50 for determining relative motion and position between the path and the readhead, such as described herein, in accordance with an aspect of the present invention.

As an alternative, the tape 46 can include a gradient gray-scale or color scale that varies along the path length, with the encoder sensor being sensitive to the changes in wavelength and/or frequency in the light reflected from the tape. By way of further illustration, alternating reflective and non-reflective elements may be positioned along the path for interaction with the beam of light from the encoder sensor. Those skilled in the art will understand and appreciate other optical, magnetic, inductive, and/or capacitive means that could be utilized to obtain a suitable indication of position and/or movement of the stage relative to the path in accordance with an aspect of the present invention.

Figure 3:
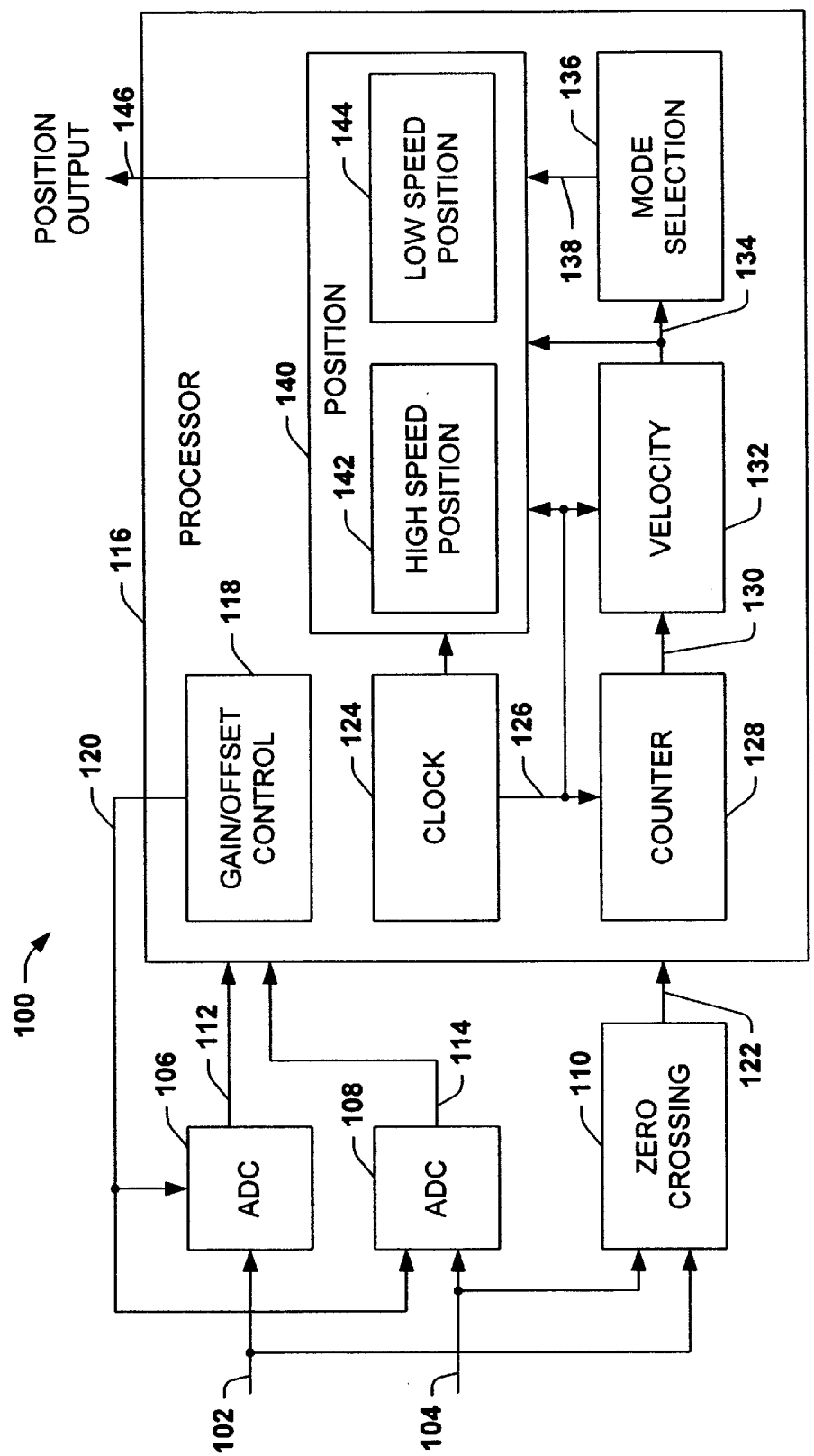
FIG. 3 is a functional block diagram of a system for improving encoder resolution in accordance with an aspect of the present invention.

FIG. 3 illustrates a functional block diagram of an interpolation system 100 in accordance with an aspect of the present invention. The interpolation system 100 receives one or more pairs of analog signals 102 and 104 having a substantially quadrature relationship, such as sine and cosine signals from an encoder (not shown). Specifically, the analog signals 102 and 104 are received at respective ADCs 106 and 108 as well as at a zero crossing detector 110. The ADCs 106 and 108 convert each of the input signals 102 and 104 into corresponding digital signals 112 and 114. The digital signals 112 and 114 are provided to a processor 116.

The processor 116 can be programmed and/or configured to include a gain/offset control 118 that processes the digital signals 112 and 114 to appropriately scale the signals 112 and 114 fro the ADCs 106 and 106, respectively. The gain/offset control 118 provides feedback control 120 to the ADCs 106 and 108 to adjust operating parameters of the respective ADCs as needed. By way of illustration, the gain/offset control 118 can control the ADCs to raise or lower the offset for the digital signals 112 and 114 so as to center the digital signals 112 and 114 relative to a halfscale voltage or current value. Thus, if gain/offset control 118 determines that the maximum and minimum values of each digital signals 112 and 114 are not centered about an expected halfscale value, the operating parameters of one or both of the respective ADCs 106, 108 can be adjusted to apply an appropriate offset to the respective digital signals.

The gain/offset control 118 further can adjust the gain of the ADCs 106 and 108 based on the measured maximum and minimum values of the digital signals 112 and 114. For example, if the maximum and minimum values of each digitized signal 112, 114 is not at desired maximum and minimum values, the gain/offset control 118 can implement feedback control 120 to adjust the gain of one or both of the ADCs 106 and 108 accordingly.

The zero crossing detector 110 provides an output signal 122 to the processor 116 in response to detecting zero crossings in one or more of the analog input signals 102 and 104. For example, zero crossings can be detected for each of the input signals 102, 104, one of the input signals, or a combination of two or more of the input signals. For example, each detected zero crossing in the input signal(s) generally corresponds to a change in magnetic or optical properties that occurs at known relative displacements between two bodies. Such known positions, for example correspond to markings or at known distances between markings, which are detected by an encoder or other position sensing device arranged to detect relative movement between the two bodies.

The processor 116 includes a system clock 124, such as free running timer programmed and/or configured to provide a periodic output 126 at a desired rate (e.g., 200 MHz or higher). A counter 128 receives the clock output 126 and the zero crossing output from the zero crossing detector 110. The counter 128 is programmed and/or configured to provide an output 130 indicative of the number of clock cycles between zero crossings. A velocity module 132 receives both the clock (or timer) value 126 and the counter output 130 from which an indication of velocity 134 is determined as a function of the count value and time between zero crossings, namely a change in time between zero crossings. The velocity module 130 provides the indication of velocity to a mode selector 136.

Figure 4:
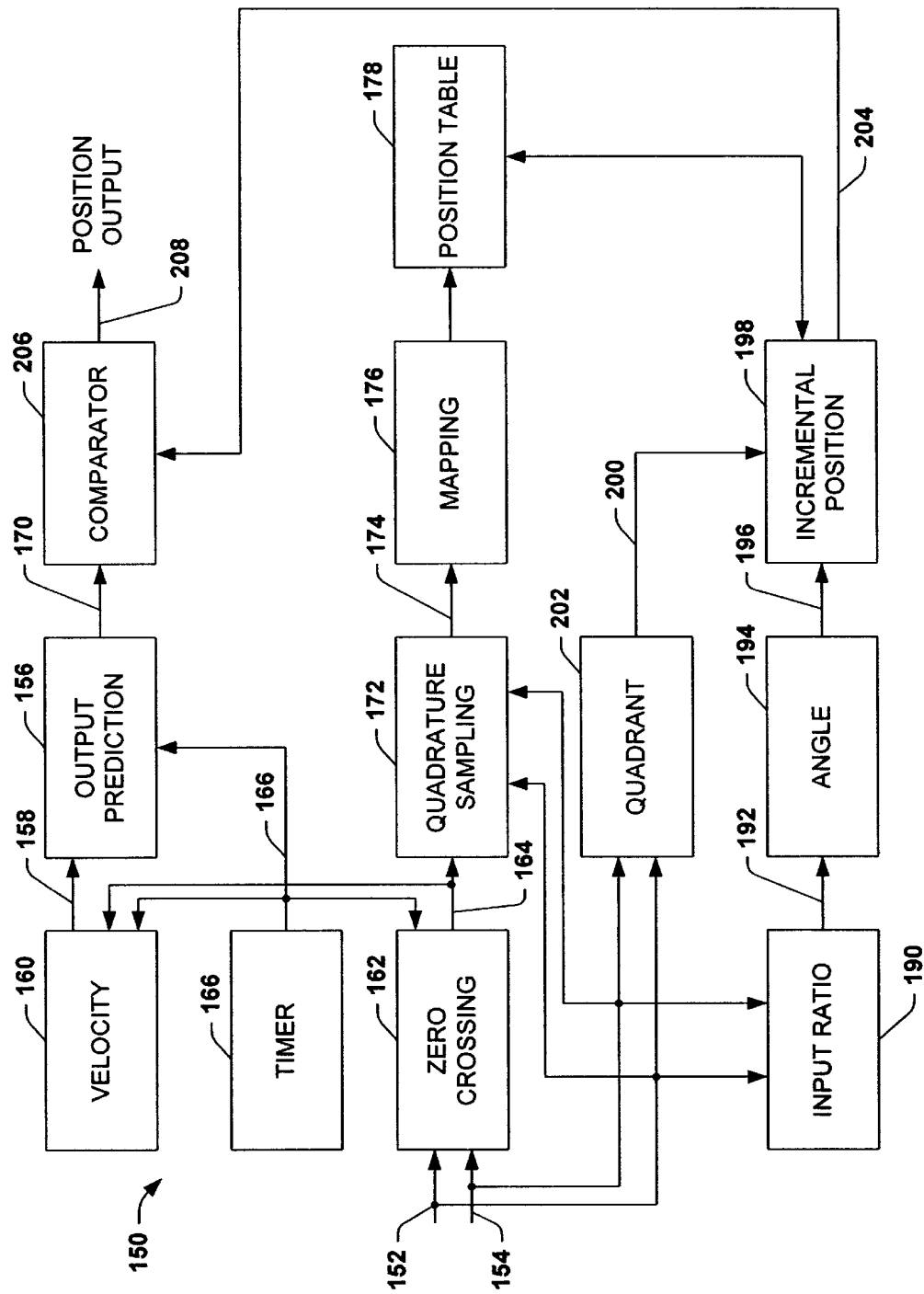
FIG. 4 is an example of a low speed position determining portion for a system for improving encoder resolution in accordance with an aspect of the present invention.

The mode selector 136 is programmed and/or configured to select an operating mode for the processor 116. The processor 116 determines how position information is derived based on the selected operating mode. The mode selector 136 provides a mode signal 138 to a position module or component 140, which can be a function, method or hardware, programmed and/or configured to determine position based on the processed input signals 102 and 104. In the example of FIG. 4, the position module 140 includes a high speed position component 142 and a low speed position component 144, each of which is operative to determine an indication of relative position based on the digital input signals 112 and 114 and/or the indication of zero crossings 122. The position module 140 provides a position output 146 corresponding to the position information determined by the respective high speed position or low speed position components 142, 144.

By way of example, the mode selector 136 can employ one or more velocity threshold values to control the operating mode of the position module 140. Because the velocity can include hysteresis, for example, it may be desirable to provide a low velocity threshold and a different high velocity threshold. Alternatively, the effects of hysteresis in the velocity can be accommodated by the velocity module 132, as is known in the art, and a single threshold used to select between the high and low speed operating modes. While various functionality has been described as occurring within the processor 116, it is to be understood and appreciated that some or all of such functionality can be implemented as hardware and/or software separate from the processor in accordance with an aspect of the present invention.

The low speed position module is operative to determine a high resolution position based on position data stored in one or more tables, which are indexed by the digital quadrature signals 112 and 114. By way of illustration, FIG. 4 depicts an example of a system 150 that can be employed to determine an indication of position, such as when the position module 140 (FIG. 4) is operating in the low velocity mode, in accordance with an aspect of the present invention. The system 150 receives digital quadrature signals 152 and 154, which are employed in the position determination. According to one aspect of the present invention, the low speed position system 150 can determine two values of position: (1) a predicted position based on previous position and the velocity and (2) an interpolated position based on the quadrature inputs and actual stored data.

An output prediction component 156 is programmed and/or configured to compute a predicted position as a function of a relative velocity 158 and time. A velocity module 160 outputs an indication of relative velocity 158 based on a time period between zero crossings. For example, a zero crossing detector 162 determines the time between zero crossings by counting the number of clock cycles between zero crossings of one or more of the quadrature input signals 152 and 154. A free running timer 166 provides the clock cycles as a clock signal 164 to the zero crossing detector 162, to the velocity module 160, and to the output prediction component 156. The timer 166 is configured to provide a pulsed output having a desired high clock frequency (e.g., about 200 MHz or higher). The velocity module 160 thus determines the indication of velocity 158 based on the number of clock cycles between zero crossings. The output prediction component 156, in turn, determines an incremental distance as a function of the velocity 158 and the change in time from the last determination (which can be constant assuming a constant clock cycle). The incremental distance is aggregated with the previous position to provide a predicted indication of position, indicated at 170.

The other indication of position in the low velocity mode is determined from the digitized quadrature input signals 152 and 154, which for purposes of the following discussion are indicated as respective sine and cosine signals that vary generally sinusoidally as a function of movement between two bodies. The zero crossing detector 162 provides the indication of zero crossings (e.g., based on one or more of the input signals 152, 154) to a quadrature sampling component 172. The sampling component 172 samples the digitized input signals a plurality of times between each zero crossing. The sampling component 172 provides values 174 indicative of the sampled input signals to a position mapping component 176. The mapping component 176 maps corresponding position information for the sampled input signals to a position table 180. That is, the values of the sampled sine and cosine signals 152 and 154 are employed to populate the table with corresponding incremental position information between detected zero crossings.

The table 180 can be populated with position information for each of the sine and cosine signals and/or be populated with position information as a function of both the sine and cosine signals (e.g., a ratio thereof). The number of samples obtained between zero crossings can be equal to a fraction (e.g., ¼, ⅛, 1/16, 1/32, etc.) of the desired total resolution between zero crossings. By way of particular illustration, for a desired resolution of about 32,000 points between zero crossings, a sample size of about 2000 actual sine and cosine values between the zero crossings should be sufficient to populate the table 178 so as to mitigate errors associated with interpolating position values from the table for the other about 30,000 points.

The table 180 can be populated when operating in the low velocity mode as well as when in the high velocity mode. Additionally, the position information stored in the table 180 can be dynamically updated during operation of the system, such that the position information in the table adapts to changes in the system 150 or its environment. Once populated with sufficient position data, the table 180 can be employed to obtain an indication of position when in the low velocity mode. Because the actual digital sine and cosine data are employed to populate the table 180, errors that may be introduced by ADCs, the position detection device that provides the sine and cosine signals 152 and 154, and/or errors due environmental effects are accounted for so that the table contains more accurate position data. As a result, the actual digital sine and cosine signals 152 and 154 map directly to incremental position values (e.g., time is fit to space between zero crossings) without needing to employ a functional computation, which might further perpetuate such errors and require additional processing for compensation.

Figure 5:
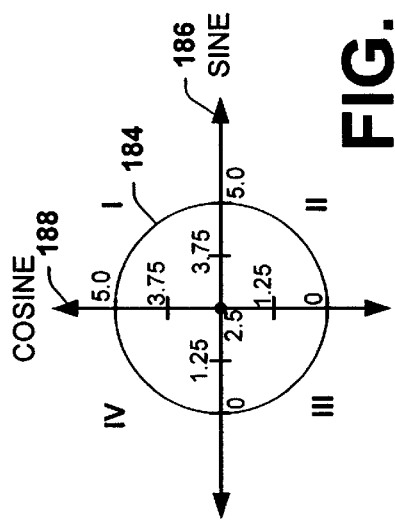
FIG. 5 is an example of a two-dimensional graphical representation of a lissajous, such as can be derived from digital encoder signals.

As shown in FIG. 5, it is to be appreciated that the position data stored in the table 180 (FIG. 4) for the sine and cosine signals 152 and 154 can be represented as a lissajous 184. The lissajous 184 is functionally related to the sine and cosine signals, which are plotted on the X and Y axes 186 and 188, respectively. The points along the lissajous 184 correspond to one of a plurality of discrete points or positions (e.g., about 32,000 or 64,000 points) between an adjacent pair of zero crossings. Some the position values in the table (e.g., a desired fraction of the table values) are stored in the table based on actual sine and cosine signals, such as described above, which define corresponding points on the lissajous 184. The remaining and typically larger portion of the table values is obtained by appropriate interpolation implemented by the DSP.

Referring back to FIG. 4, the sine and cosine signals 152 and 154 are provided to an input ratio component 190, which obtains a value indicative of a ratio of the respective input signals. The ratio component 190 provides an output 192 to an angle determining component 194 that derives an indication of an angle (e.g., a tangent angle) 196 based on the ratio of the sine and cosine signals.

For example, the lissajous 184 of FIG. 5 can be considered as divided into four ninety degree quadrants, namely, quadrants I, II, III, and IV. The ratio 192 of the sine and cosine signals for a particular sample corresponds to an angle (e.g., between zero and ninety degrees), which maps to a location in each of the quadrants. That is, the ratio 192 of sine and cosine values corresponds to one of four possible positions along the lissajous. The angle 188 is provided to an incremental position component 190. In order to determine the position with greater certainty, the incremental position component also receives an indication of the quadrant 200 of the lissajous. That is, a quadrant detector 202 determines in which quadrant the respective sine and cosine signals 152 and 154 lie. Because the signals 152 and 154 are digital, the quadrant detector 202 can determine the sign (e.g., positive or negative) of the signals based on the value of the sine and cosine signals relative to an associated halfscale (e.g., 2.5 volts for a scaled signal between 0 and 5 volts) for the respective signals.

The incremental position component 198, in turn, can determine a location (or points) along the lissajous based on the quadrant 200 and angle 196. The incremental position 204 corresponds to a relative displacement from a position at which the previous zero crossing occurred based on the position information in the table 180. When the location on the lissajous does not contain a stored position data, appropriate position data can be derived by interpolating (e.g., linear interpolation) between nearest neighbor positions along the lissajous, as stored in the table 180. Accordingly, the determined position along the lissajous corresponds to an incremental position or displacement between known positions associated with detected zero crossings.

Those skilled in the art will understand and appreciate various interpolation techniques that can be utilized to obtain the position values as a function of the quadrature encoder data signals, all of which are contemplated as falling within the scope of the appended claims. The particular manner in which interpolation is employed further can vary depending on processing requirements and memory constraints associated with a specific implementation thereof. The interpolation of the position data can be performed on the fly, such as based on the current sine and cosine signals 152 and 154. Alternatively or additionally, the interpolation can be implemented prior to usage of the system 150, such as during a calibration phase in which associated moving bodies are activated to move in a desired manner.

The system also includes a comparator 206 that receives the predicted position 170 and the position 204 determined from the table 180. The comparator 206 is programmed and/or configured to determine whether the predicted position 170 is equal to or within an expected value of the position 204 derived from the table 180. If the predicted value is within an expected window of the table derived position, operation of the system continues with the predicted value being provided by the comparator as a high resolution position 208, such as a thirty-two bit position. That is, the predicted output can be used as the position value in the low speed mode so long as it remains within an expected window of the position 204 derived from the table. If the predicted value 170 is outside an expected window of the table position 204 (usually for a predetermined number of cycles), an error can be reported and the table position used to update or adjust the current predicted position. In this way, the table position determination provides a redundant position, which can run in the background to detect errors in the predicted position. Alternatively, the prediction 170 could be omitted and the position 208 determined by the incremental position component 198 could be provided as the position output in the low speed operating mode.

Figure 6:
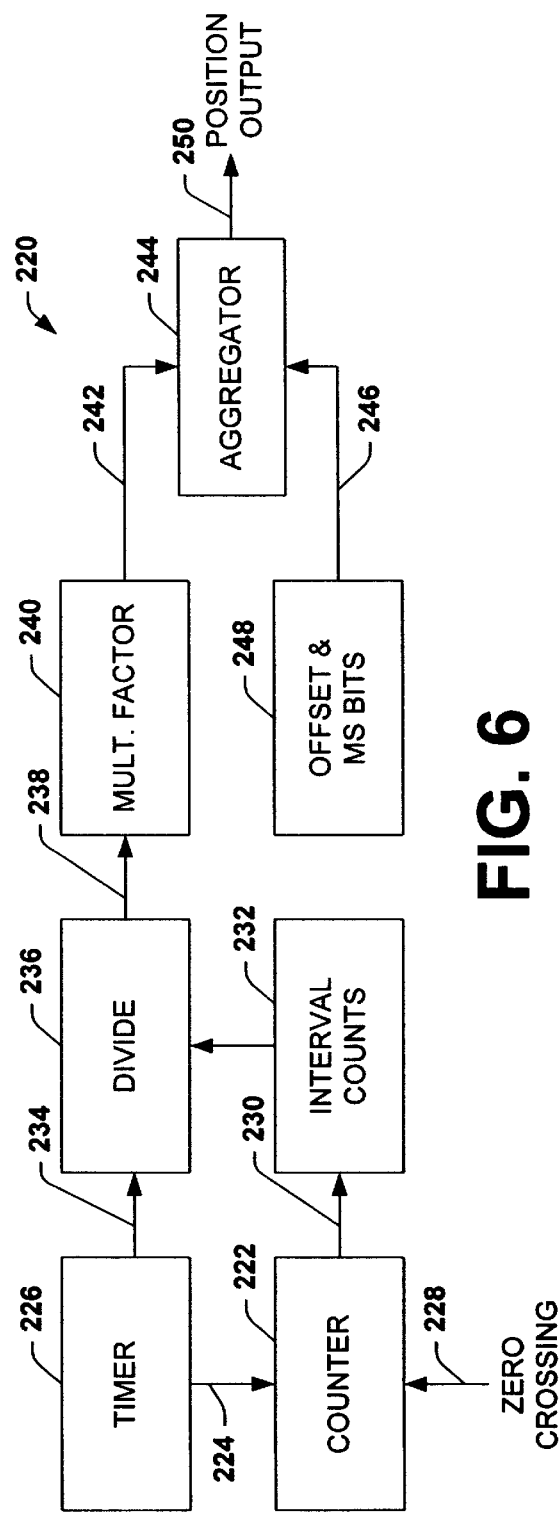
FIG. 6 is an example of a high speed position determining portion for a system for improving encoder resolution in accordance with an aspect of the present invention.

FIG. 6 depicts a functional block diagram of a system 220 that can be employed to determine an indication of relative position for two moving bodies, such as when the relative speed between the bodies equals or exceeds a high speed threshold. The system 220 includes a counter 222 that receives clock pulses 224 from a timer 226 and an indication of zero crossings 228, such as from a zero crossing detector. The zero crossing detector is operative to provide an indication of when one or more position-indicating signals crosses a predetermined level, which can be zero or any other level within a range associated with the position-indicating signal(s). The counter 222 provides an output 230 which is stored as an interval count 232 having a value indicative of the number of clock pulses between zero crossings. The interval count 232 is reset with each zero crossing. The timer 226 also provides a timer value 234 that indicates a relative free running time value for the system 220 that changes with the clock pulses 224. A divide component 236 divides the timer value 234 by the interval count 232 to provide a value 238 that represents a fraction (e.g., between zero and one) of the relative displacement between two known relative positions of the moving bodies. The known relative positions occur at zero crossings.

The value 238 from the divide component 236 is multiplied by a multiplication factor 240 to provide an output 242 indicative of an incremental position having a desired number of bits. For example, if a fifteen bit incremental position resolution is desired, the value 238 can be multiplied by 32768 to provide a fifteen bit output at 242 having a value between zero and 32768. That is, the multiplication factor 240 operates to identify what is the current incremental position (e.g., a fraction between zero and one) of the available 32768 positions between zero crossings. The incremental position 242 is provided to an aggregator 244. The aggregator 244 also receives information 246 from an offset and MSBs (Most Significant Bits) module 248. While the module 248 is illustrated as containing both an offset and MSB functions, it is to be understood and appreciated that separate functions could be employed to provide the offset and the MSB. The aggregator 244 employs the offset to adjust the zero point of the incremental position to a desired level. The aggregator 244 combines the MSBs with the incremental position 242 to provide an absolute position 250 of a higher order. For example, the MSBs can correspond to the seventeen MSBs (e.g., a crude position) obtained from previous position data, such as associated with an absolute position in a previous cycle. Alternatively or additionally, the MSBs can be derived as a more crude position by another position determining system. Thus, the aggregator 244 adds the incremental position with the MSB to provide a high resolution indication of position 250, such as a thirty-two bit (or higher) position. The position information can be provided to any device or system that might desire highly accurate position, such as a controller for a high precision motor (rotary or linear).

In view of the exemplary systems shown and described above, methodologies that can be implemented in accordance with the present invention will be better appreciated with reference to the flow diagrams of FIGS. 7–13. While, for purposes of simplicity of explanation, the methodologies are shown and described as implementing serially, it is to be understood and appreciated that the present invention is not limited by the illustrated order, as some features can, in accordance with the present invention, occur in different orders and/or concurrently with other features shown and described herein. Moreover, not all illustrated aspects may be required to implement a methodology in accordance with the present invention. The functionality described herein can be implemented as hardware and/or software. For example, the methodologies of FIGS. 7–13 can be described in the general context of computer-executable instructions, such as program modules, executed by one or more microprocessors, microprocessor-based devices, application specific integrated circuits or combinations thereof.

Figure 7:
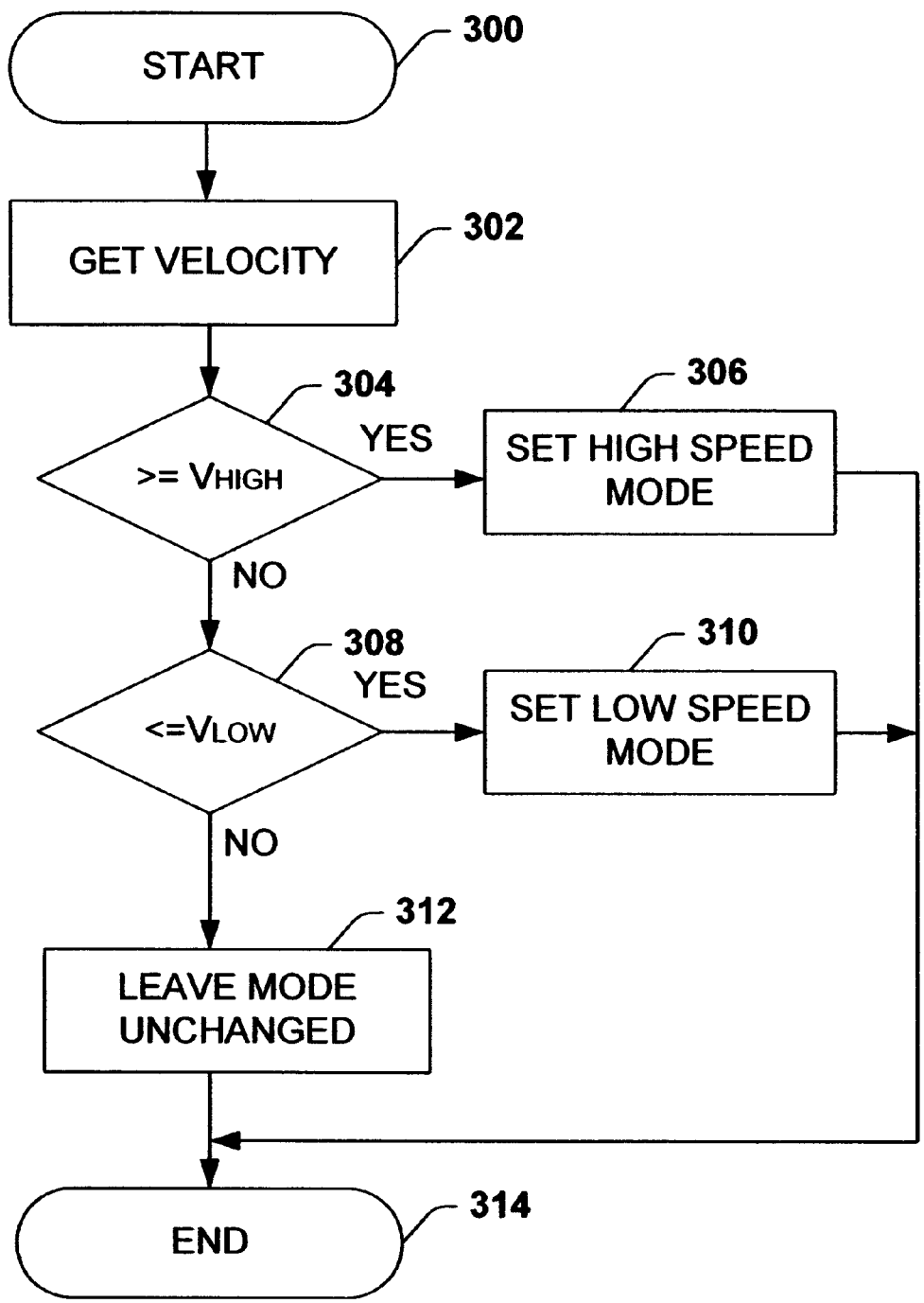
FIG. 7 is a flow diagram illustrating a methodology to determine an operating mode of a position determining system in accordance with an aspect of the present invention.

FIG. 7 illustrates a methodology for selecting an operating mode in accordance with an aspect of the present invention. The methodology begins at 300 in which variables and other parameters as set to their starting values. Next, at 302 an indication of velocity is obtained. The velocity corresponds to the relative velocity between a pair of bodies, such as, for example, a stage (or rotor) and a platen (or stator) of a motor. From 302, the methodology proceeds to 304.

At 304, a determination is made as to whether the velocity is greater than or equal to a maximum velocity threshold $V_{high}$. If the determination is positive, the methodology proceeds to 306 in which the high speed mode is set to an ON condition. If the determination at 304 is negative, indicating the velocity is less than $V_{high}$, the methodology proceeds from 304 to 308. At 308, a determination is made as to whether the velocity is less than or equal to a minimum velocity threshold $V_{low}$, where $V_{low} < V_{high}$. If the velocity is less than or equal to $V_{low}$, the methodology proceeds to 310 in which the low speed mode is set to an ON condition. If the determination at 308 is negative, the methodology proceeds to 312 in which the mode remains unchanged. This might correspond to a situation, for example, when the velocity is between $V_{high}$ and $V_{low}$. Because a pair of velocity thresholds are used, the methodology of FIG. 7 can accommodate hysteresis in the velocity, without changing modes in response to minor fluctuations in the velocity. It is to be appreciated, however, that a single threshold could be utilized if the velocity value was processed to compensate for such hysteresis.

From each of 306, 310, and 312, the methodology proceeds to 314 and ends. The methodology can be implemented at a predetermined rate or in response to a known stimulus or in response to a call from another function or method. In this way, an appropriate operating mode can be selected as a function of the velocity.

Figure 8:
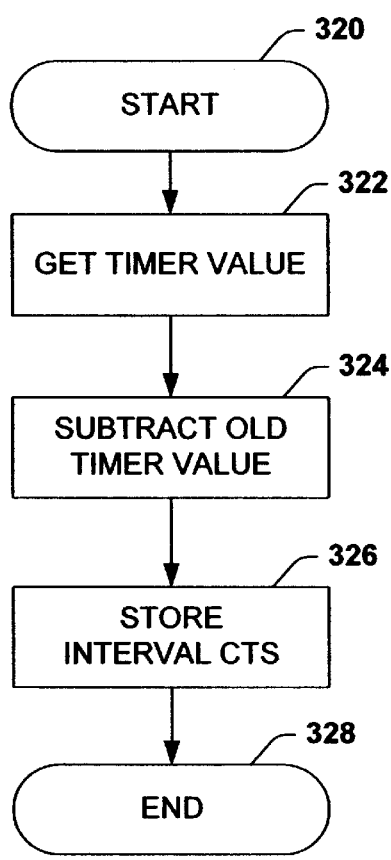
FIG. 8 is a flow diagram illustrating a methodology for determining relative velocity of moving bodies in accordance with an aspect of the present invention.

FIG. 8 illustrates a methodology for computing an indication of velocity between a pair of bodies moveable relative to each other. The methodology begins at 320 and proceeds to 322 in which a timer value is obtained. The timer value, for example, corresponds to value a time value of free running clock having a desired high frequency, such as about 200 MHz or higher. Of course, other clock speeds also could be used. The getting of the timer value can be initiated by a signal associated with a known position. In one aspect, the signal might correspond to a zero crossing of one or more time varying encoder signals, in which each zero crossing occurs in response to detection of a marking or magnetic field. Thus, each timer value corresponds to a time (or number of counts) associated with detection of an event or position.

Next, at 324, a previous timer value is subtracted from the timer value obtained at 322. Thus, the value obtained at 324 corresponds to a change in time between detection of adjacent events or positions. The change in time is stored at 326 in suitable memory as a timer interval, namely as a number of interval counts. Because the distance between adjacent events occurs is known, such as may correspond to a physical distance between adjacent markings or a known distance relative to one or more markings, the relative velocity varies as a function of the change in time computed at 324 and the known distance. The velocity methodology ends at 328, with the stored time value made available for further processing, such as the mode selection methodology of FIG. 7 and others. The velocity methodology can be implemented at a predetermined rate or be initiated in response to detecting a known condition, such as a zero crossing in one or more received encoder signals.

Figure 9:
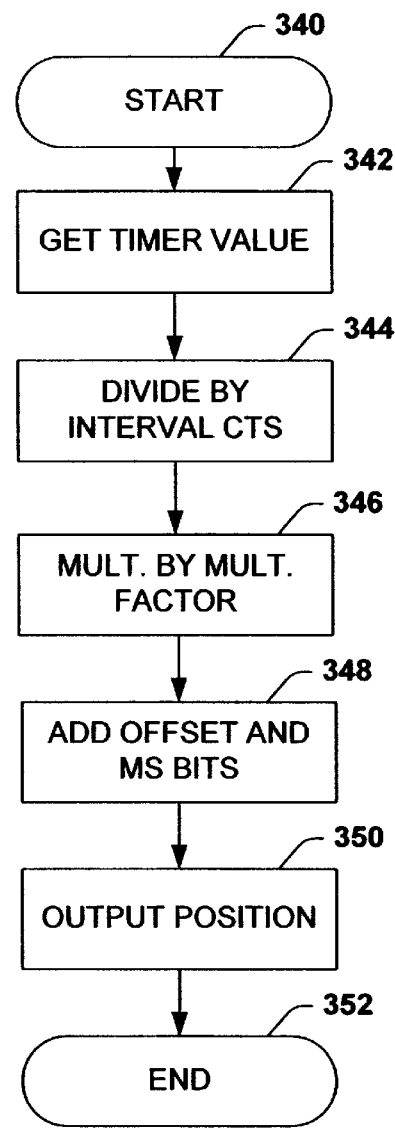
FIG. 9 is a flow diagram illustrating a methodology for determining position of a moving body at high speeds in accordance with an aspect of the present invention.

FIG. 9 illustrates a position computation that can be employed when in the high speed operating mode, such as determined in the methodology of FIG. 7. The methodology of FIG. 9 begins at 340 in which appropriate parameters are initialized to their starting values based on the current state and circumstances. At 342, a timer value is obtained, such as from a free running clock having a desired high frequency. The timer value obtained at 342 is then divided by a stored interval count value at 344, such as the value stored at 326 in FIG. 8. The computation at 344 provides an indication of a percentage or fractional distance between adjacent positions, such as corresponds to a distance between markings along encoder scales.

Next, at 346, the value obtained at 344 is multiplied by a selected multiplication factor. The multiplication converts the value into a count representing an incremental distance between two known positions. For example, where each of the known positions corresponds to a marking (or known position relative to the markings) or other indicia along a path of a motor (e.g., rotary or linear), the markings can be detected as zero crossings in an encoder output signal. The computation at 344 thus provides an indication of relative displacement between the adjacent markings the two parts of the motor have moved between timer values. The multiplication factor employed at 346 scales the fractional distance to a desired number of bits so as to convert the fractional distance to a binary count corresponding to an incremental distance having a known resolution of a desired number of bits. For example, the multiplication factor can be 32768, such that the incremental position count value includes fifteen bits. It is to be appreciated that other multiplication factors can be employed to provide other orders of resolution for the incremental distance.

Next, at 348, the scaled incremental distance is offset to adjust the zero point of the distance value. Additionally, further most significant bits are added to the value of the scaled distance to provide a higher order position value having a desired number of bits equal to the number of bits at 346 and the additional bits being added at 348. For example, if the incremental position value includes fifteen bits and the bits being added at 348 include seventeen bits, the resulting position is a thirty-two bit high resolution position count. The most significant bits, for example, can be obtained as the most significant bits from a previous high resolution position value, such as obtained during a last processing cycle, or a low resolution (e.g., more crude) position sensing device.

Next, at 350 the high resolution position is output, such as to a host or other device desiring an accurate indication of position between the moving bodies. The high speed mode position calculation methodology then ends at 352. It is assumed that, even at high speed modes the MSBs of the position value do not change from cycle to cycle. Further, while the velocity is calculated over a previous distance, it is assumed that velocity does not change a significant amount between cycles. Accordingly, these assumptions enable an accurate determination of position at high speeds during the high speed operating mode with reduced overhead when compared to most conventional systems.

Figure 10:
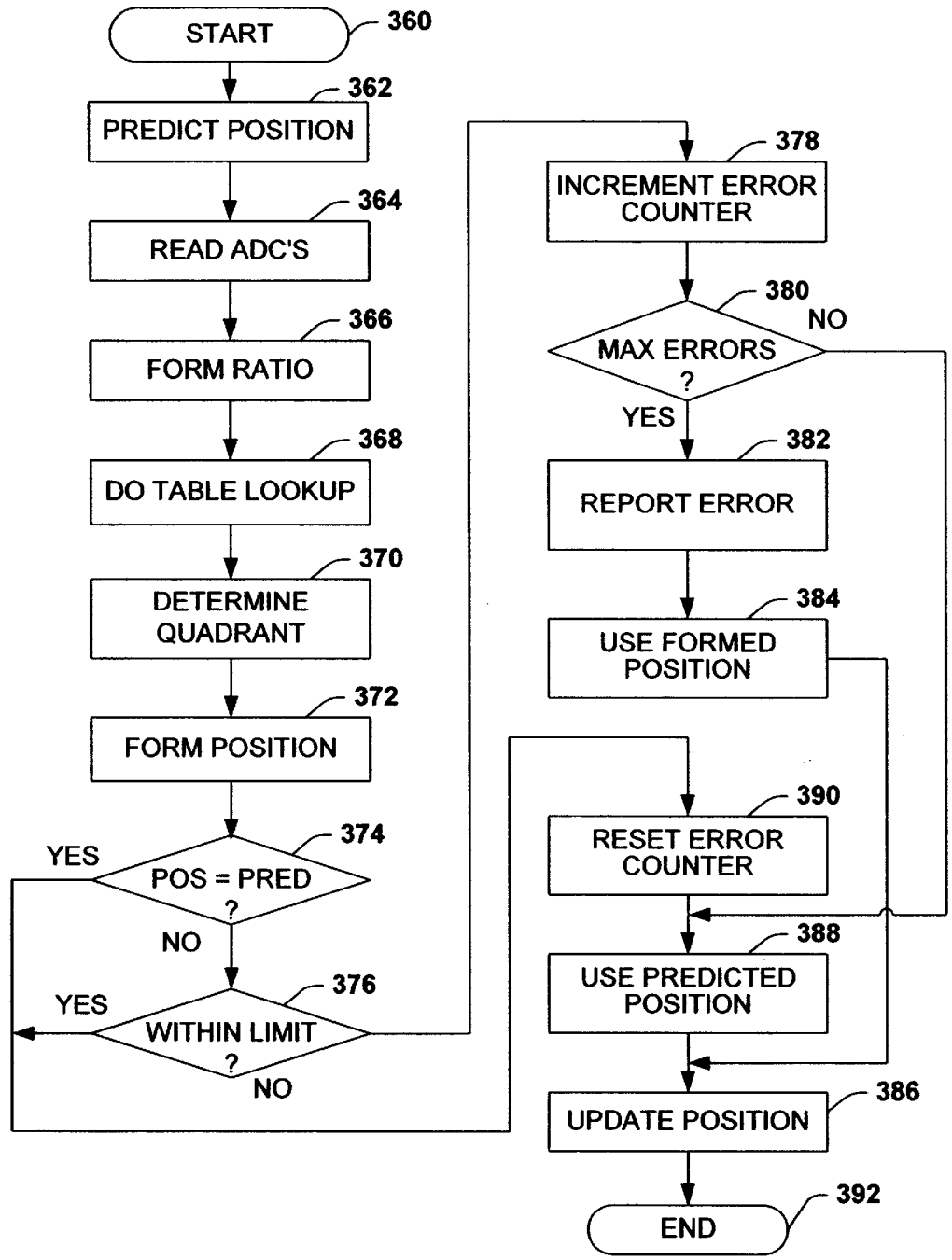
FIG. 10 is a flow diagram illustrating a methodology for determining position of a moving body at low speeds in accordance with an aspect of the present invention.
Figure 11:
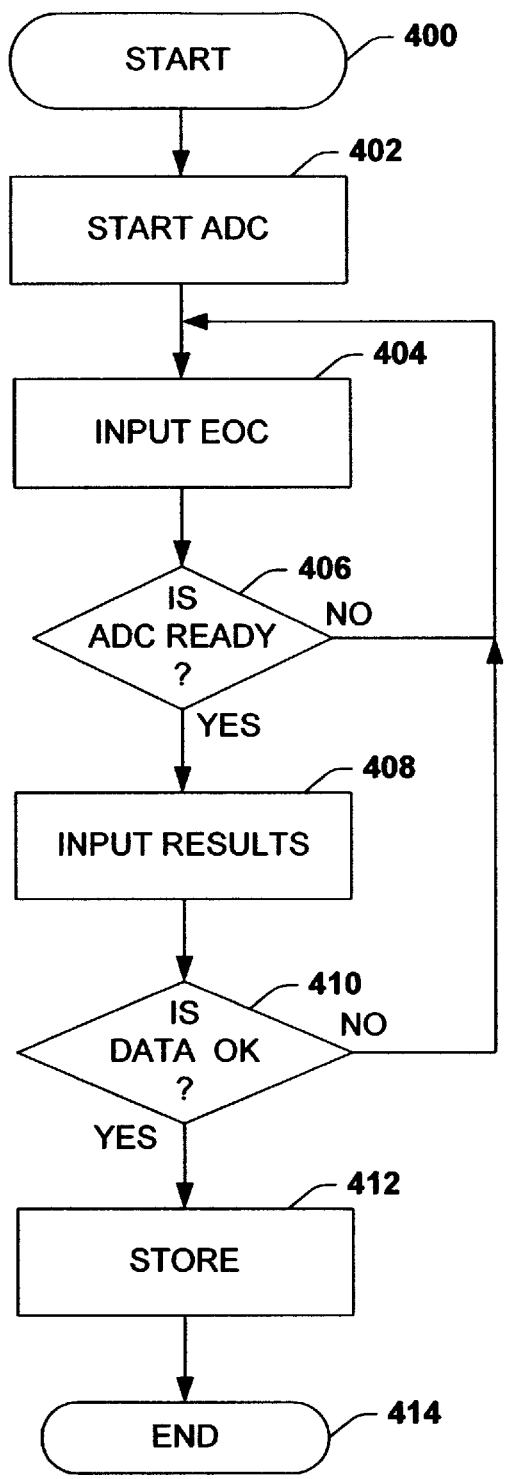
FIG. 11 is a flow diagram illustrating a methodology for obtaining digitized encoder data in accordance with an aspect of the present invention.
Figure 12:
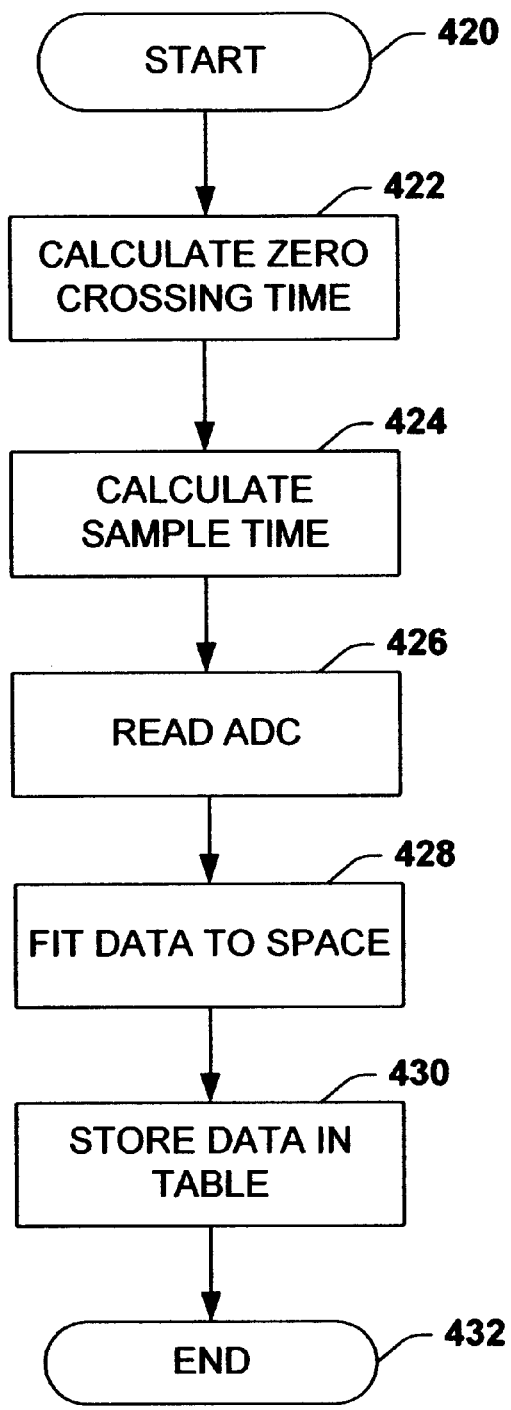
FIG. 12 is a flow diagram illustrating a methodology for populating a position table in accordance with an aspect of the present invention.

FIGS. 10–12 collectively illustrate different parts of a position calculation methodology when operating in the low speed mode. Turning to FIG. 10, the methodology begins at 360, such as in response to entering the low speed mode or entering the next cycle within such mode. Next, at 362, a position value is predicted. The position value can be predicted in a manner similar to that employed to compute position in the high speed mode. For example, the position can be computed by adjusting the previous position value based on the relative velocity and time. A value can be predicted with every clock cycle, such as, for example, every 125 microseconds or based on the current clock speed. To facilitate operation of the a system employing this methodology, the predicted value can be output as the position value (e.g., a count.

From 362, the methodology proceeds to 364 in which input data is read from one or more ADCs. The input data, for example, corresponds to analog quadrature signals from an encoder, such as sine and cosine signals, generated in response to detecting markings or indicia on a surface, which signals vary as a function of relative movement between the two bodies. The analog signals are converted from their analog to a digital representation. From 364, the methodology proceeds to 366.

At 366, a ratio is formed based on the digital signals. The ratio, for example, provides a value associated with four possible locations along a lissajous. The lissajous is a two dimensional construct that represents points between adjacent zero crossings in one or more of the digital input signals. The lissajous is generally circular about its origin and functionally related to the digital signals used to form the ratio (e.g., digital sine and cosine values). An example of a lissajous is shown and described with respect to FIG. 5. The lissajous has four quadrants and the ratio computed at 366 provides an angle between zero and ninety degrees in each quadrant. Each angle thus provides a point along the lissajous curve, which position maps to a corresponding incremental position value between known positions associated with zero crossings.

Next at 368, a lookup table is accessed to provide position information based on the ration computed at 366. Alternatively or additionally, a lookup operation can be performed individually for each of the digital signals read at 364. As just mentioned, the lookup provides position values along the lissajous associated with the digital input signals. That is, the lookup operation provides position data associated with one or more incremental positions between zero crossings, which incremental position is defined in terms of the points along the lissajous. When position information from the table does not match the digital inputs used to index the table, position information can be interpolated from the table. For example, if a resolution of about 32000 points between zero crossings is desired, a sample size of about 2000 points along the lissajous may be sufficient basis to populate the table and provide a desired level of accuracy and low error. From 368, the methodology proceeds to 370.

At 370, a quadrant along the lissajous is determined, such as based on the digital input signals read at 364. For example, because the signals are digital signals, the signals usually are centered about a positive voltage, such as varying between zero and five volts and centered about 2.5 volts. The quadrant determination at 370 is made based on the value of the input signals relative to the halfscale voltage (e.g., 2.5 volts). Next, at 372, the incremental position is formed based on the value(s) returned from the lookup table and the quadrant determined at 370. The incremental position can be derived by dividing the lissajous into a desired number of points along the lissajous curve so as to provide a desired level of resolution. Each of the points along the lissajous maps to an incremental position between known positions that occur between zero crossings. The incremental position further can be added to a previous position to provide an indication of absolute position, such as from a count value having a desired number of bits.

By way of illustration, the lissajous is generally circular about its origin, with each quadrant containing ¼ of the desired resolution. For a desired resolution of about 32000, a zero degree angle corresponds to a zero position (e.g., the most recent zero crossing), 90 degrees corresponds to about 8000, 180 degrees corresponds to about 16000 (e.g., about midway between zero crossings), and 360 degrees corresponds to about 32000 (e.g., the next zero crossing). As a result, an incremental position between zero crossings can be determined for each such point along the lissajous, such as by interpolating between known positions from the table to provide the desired resolution. The interpolation can be performed on the fly or during a set up mode in which the values are stored, which might vary depending on available memory and/or processor power.

Next at 374 a determination is made as to whether the position determined at 372 is equal to the predicted position. If the position at 372 is not equal to the predicted position the methodology proceeds to 376. At 376, a determination is made as to whether the position formed at 372 is within a predetermined limit of the predicted value, such as within a predetermined error window. If the determination at 376 is negative, indicating the position is not within an expected error of the predicted position, the methodology proceeds to 378 in which an error counter is incremented. The error counter is used to track the number of position errors.

Next at 380, a determination a determination is made as to whether the error counter has reached a maximum error count value. If a maximum error count value is reached, the methodology proceeds to 382 in which an error is reported. The error is reported to identify that the position data being provided while in the low speed mode may be corrupted or is otherwise not trustworthy. Accordingly, the system employs the incremental position value (384), which is formed from the data stored in the lookup table to update the predicted position data at 386. If, at 380, the maximum error count has not been reached, the methodology proceeds to 388 in which the predicted position value is use to update the position data at 386, which value corresponds to the predicted incremental position computed at 362. The updated position value is utilized during the next cycle with the methodology of FIG. 10.

If the determination at either 374 or 376 is affirmative, indicating that the predicted position is equal to or within a defined error limit of the position value formed at 372, the methodology proceeds to 390. At 390, the error counter is reset to its starting value. Next at 388, the predicted position value is used to update the position value at 386. As indicated above, however, if the predicted position is outside of the expected range of the formed position for a predetermined number of cycles, the formed position can be used to update the predicted position for the next cycle.

After updating the position data at 386, the methodology ends at 392 for the present cycle. The methodology typically is repeated for each cycle when in the low speed mode to help update the predicted position, which is provided as its high resolution output (e.g., a 32 bit position) and will be either updated based on the predicted position information or the position value computed from the table, as described above.

FIG. 11 illustrates an example of a methodology that can be employed to control reading digital information from one or more ADCs. The methodology begins at 400, such as at power up in which appropriate parameters as set to their starting values to facilitate control and operation of the ADC. Next, at 402, the ADC is started so as to begin capturing analog data, such as sine or cosine data from an encoder. At 404, the end of conversions is input (e.g., received at a DSP), indicating that the present conversion to digital data is complete. Next at 406, a determination is made as to whether the ADC is ready and providing digitized data. If the determination is negative, the methodology returns to 404 to wait for an indication that the conversion is complete. After the ADC is determined to be ready, the digital signal is input at 408, such as to a buffer.

Next at 410, a determination is made as to whether the digital signal is okay, such as within a predictable window of values based on one or more previous samples of the digital signal. For example, the digital signal is a digital representation of a sine or cosine signal, which is expected to change in a predetermined manner. If the next value is not within its expected value, an error condition may exist and require further correction or processing. Thus, if the determination at 410 is negative, methodology returns to 404 to obtain additional samples for converting to a digital representation. Alternatively or additionally, the methodology can provide a corrected value or compensate for the input provided at 408. Thus, the determination at 410 provides a filtering function to filter out data not within an expected window of values. If the data is within a predictable window of values, the methodology proceeds to 412 in which the digital signal is stored, such as in associated memory (e.g., RAM, SDRAM, SRAM etc.). From 412, the methodology ends at 414.

FIG. 12 illustrates a methodology for generating a lookup table that can be employed to provide position information during a low speed mode in accordance with an aspect of the present invention. The methodology begins at 420 in which initial parameters for the table are set to their starting values, such as at power up of a system incorporating the methodology. Next at 422, a zero crossing time is computed. The zero crossing time, for example, is computed based on one or more time-varying signals, such as one or more outputs of an encoder (e.g., sine and/or cosine signals). The zero crossing time corresponds to a time period the between the encoder detecting an adjacent pair of markings or other indicia. A sample time for the zero crossing time is calculated at 424, such as based on a snap shot at for the occurrence at the zero crossing.

Next, at 426, values of one or more digital signals are read at the sample time. The digital signals, for example, correspond to quadrature output signals obtained at the sample time from an associated encoder, such as obtained according to the methodology of FIG. 11. The information contained in the digital signals is processed to fit the data to space at 428, such as the space or displacement between known positions associated with zero crossings. For example, a ratio between the quadrature output signals can be obtained and a phase offset between the signals calculated. The computed ratio and offset can then be employed to adjust how the digital data should be stored, such as by modifying the data based on such computations. Next at 430, the digital signals (as modified) are stored in the table, such that the table contains actual values of the digital signals or a ratio thereof for a corresponding incremental position. After the data is stored in the table the methodology ends at 432.

It is to be appreciated that the methodology of FIG. 12 typically is implemented for a desired plurality of digital samples of the number of positions between zero crossings. Further, the table can be dynamically populated during operation of a system that implements such a methodology. In this way, errors associated with interpolating position information from the table can be mitigated. Because the actual digital signals (e.g., sine and cosine values) are employed to populate the table, system errors and errors resulting from environmental effects are accounted for in the position information obtained from the table. Consequently, interpolation of the stored data also provides more accurate position information from conventional systems, which tend to rely on functional computations of sine and cosine. In contrast, most conventional systems require additional computationally expensive functional calculations for compensating for errors being introduced during system operation.

Figure 13:
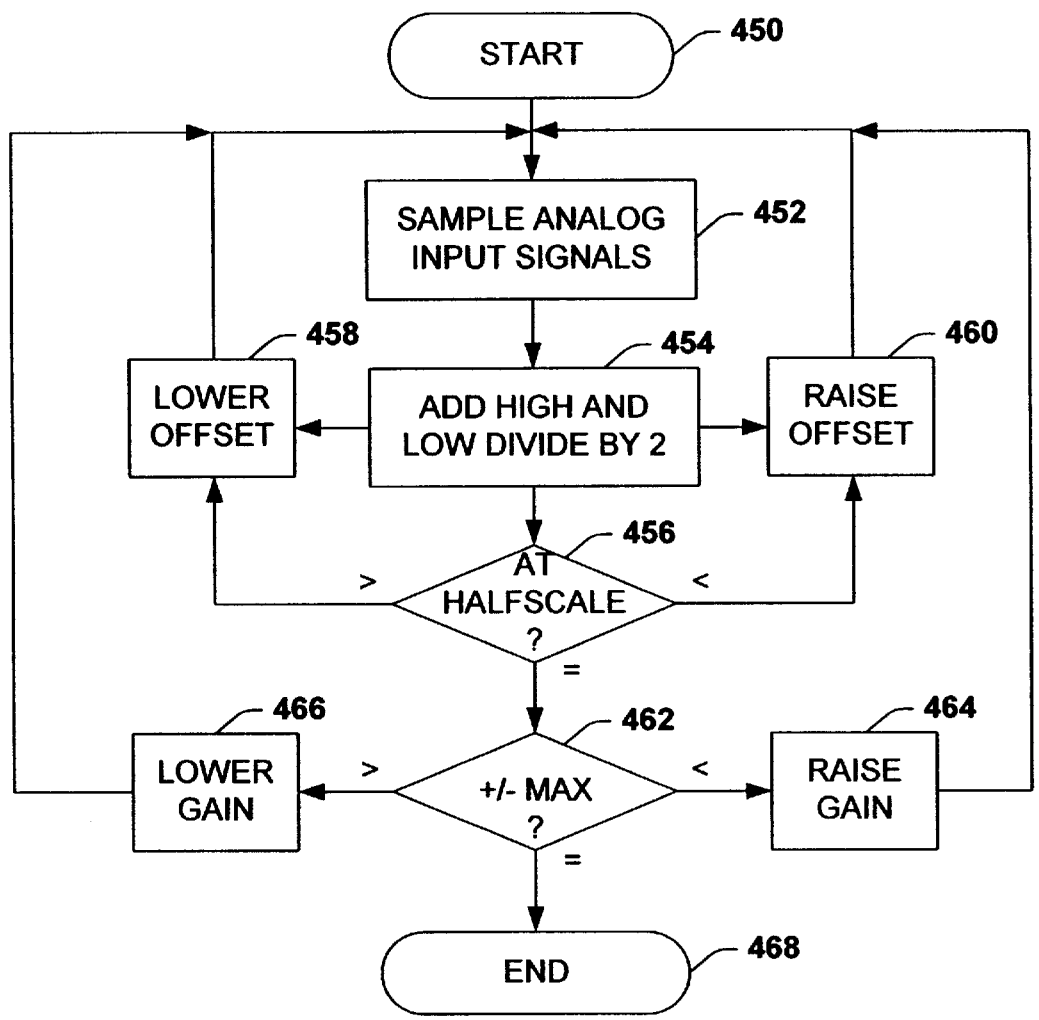
FIG. 13 is a flow diagram illustrating a methodology to adjust gain and offset of quadrature signals in accordance with an aspect of the present invention.

FIG. 13 illustrates a methodology for adjusting gain and offset of an ADC that can be utilized in accordance with an aspect of the present invention. The methodology begins at 450 and proceeds to 452 in which analog sine and cosine signals are sampled. The sampling can occur for several cycles, such as during a calibration phase. Next, at 454, an actual midpoint in a sampled signal is determined, such as by adding the maximum and minimum peak values and dividing by two. At 456, a determination is made whether the value computed at 454 is equal to, less than or greater than a predetermined half scale value. This enables an appropriate level of offset to be applied, as needed. For example, if the determined value is greater than the halfscale, the methodology proceeds to 458 and an offset is decreased. If the determined value is less than the halfscale, a positive offset can be applied to the analog input. From each of 458 and 460 the methodology returns to 452 with the applied offset adjusting the analog input signals. If the value determined at 454 is equal to the halfscale at 456, indicating that no additional offset is required, the methodology proceeds to 462.

At 462, a determination is made concerning the maximum positive and negative values of the analog inputs relative to respective predetermined maximum positive and negative values. For example, the determination at 462 can include determining whether the maximum positive and negative values of the analog inputs are equal to, less than, or greater than respective predetermined maximum positive and negative values. If the maximum or minimum positive value is less than the predetermined maximum or minimum value, the gain can be increased accordingly at 464. If the maximum or minimum positive value is greater than the predetermined maximum or minimum value, the gain can be lowered accordingly at 466. Once the maximum and minimum values of the input signals are equal to the predetermined maximum and minimum values, the methodology proceeds to 468 in which the methodology ends. The methodology can be implemented periodically to make appropriate adjustments to the gain and offset of the analog input signals to help ensure reliable and accurate data is be processed in accordance with the other methodologies described herein.

What has been described above includes examples in which the present invention can be implemented. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for improving encoder resolution, comprising:
   a velocity module operative to determine a relative velocity between moving bodies and provide an indication thereof based on received encoder information;
   a low velocity position module operative to, when in operating in a first mode based on the relative speed, determine an indication of relative position between the moving bodies based on data stored in a position table, the position table being populated with position data based on at least some of the received encoder information; and
   a high velocity position module operative to, when in operating in a second mode based on the relative speed, determine an indication of relative position between the moving bodies as a function of the relative velocity.

2. The system of claim 1, the low velocity position module further being operative to determine an indication of relative position based on a position prediction and operative to provide an indication of the relative position based on at least one of the position prediction and on the indication of relative position between the moving bodies based on data stored in the position table.

3. The system of claim 2, the low velocity position module being operative to provide an indication of the relative position based on the position prediction and to correct the position prediction for a subsequent cycle if a comparison between the position prediction and the indication of relative position between the moving bodies based on data stored in the position table indicates an unexpected error in the position prediction.

4. The system of claim 1, the indication of relative position based on the data stored in the position table being derived from the data stored in the position table by interpolating between data stored in the position table.

5. The system of claim 1, further comprising a zero crossing detector operative to provide an indication of zero crossings based on the received encoder information, the position table mapping a plurality of incremental positions that occur between positions associated with an adjacent pair of zero crossings.

6. The system of claim 5, the plurality of incremental positions comprising at least about 32000 incremental positions between the adjacent pair of zero crossings.

7. The system of claim 5, further comprising a counter operative to determine a number of counts between zero crossings based on a timer value, the relative speed being functionally related to the number of counts between zero crossings.

8. The system of claim 1 further comprising a mode selector operative to select the first mode when the relative speed is less than a first threshold and the second mode when the relative speed is greater than a second threshold.

9. The system of claim 8, the first and second thresholds being the same.

10. The system of claim 8, the first and second thresholds being different.

11. The system of claim 1, the position table being populated with digitized encoder information that includes at least two encoder signals having a generally quadrature relationship.

12. The system of claim 11, the population table being populated with incremental position data based on a plurality of samples of the two encoder signals that occur over a known distance.

13. The system of claim 12, further comprising a zero crossing detector operative to provide an indication of zero crossings based on the received encoder information, the known distance occurring between zero crossings detected by the zero crossing detector.

14. The system of claim 13, the position table representing a lissajous functionally related to the two encoder signals for the plurality of samples that occur between a pair of zero crossings, points along the lissajous being associated with incremental positions over the known distance.

15. The system of claim 14, the low velocity position module further being operative to compute an angle based on a ratio of the two encoder signals, the computed angle mapping to at least one point along the lissajous corresponding to at least one of the incremental positions.

16. The system of claim 15, the low velocity position module being operative to determine a point along the lissajous as a function of the computed angle and a quadrant, such that the point along the lissajous corresponds to an incremental position over the known distance, and the quadrant being determined based on the relative values of the two encoder signals.

17. The system of claim 1, further comprising at least one of gain and offset control operative to dynamically correct respective amplitude and offset of the received encoder information.

18. A system for improving encoder resolution, comprising:
   a position module that operates in at least two operating modes to provide an indication of a relative position between a pair of bodies that are moveable relative to each other;

in a first of the at least two operating modes, the position module determining an indication of position by interpolating between position data of a position table based on received encoder data;

the position table being dynamically populated with digitized encoder data indicative of relative position between the pair of bodies;

in a second of the at least two operating modes, the position module determining an indication of position as a function of a determined relative velocity between the pair of bodies and previous position information; and a mode selector that selects an operating mode for the position module according to the relative speed between the pair of bodies.

19. The system of claim 18, further comprising at least one analog-to-digital converter that digitizes analog encoder signals into the received encoder data, and at least one of gain and offset control operative to dynamically control the at least one analog-to-digital converter to adjust at least one of amplitude and offset associated with the received encoder data.

20. A system for improving resolution of a position sensing device that senses relative movement between a pair of bodies, comprising:

means for determining an indication of relative position when a relative speed between the pair of bodies is below a threshold, the indication of relative position being determined by at least one of
(i) means for predicting relative position between the pair of bodies and
(ii) means for looking up relative position between the pair of bodies; and means for determining an indication of relative position based on a relative velocity between the pair of bodies when the relative speed between the pair of bodies is above a threshold.

21. The system of claim 20, further comprising means for adjusting at least one of gain and offset of received encoder data to facilitate accurately determining the indication of relative position.

22. A method for improving resolution of an encoder that provides an encoder signal indicative of relative motion between two bodies, the method comprising:

determining an indication of a relative velocity between the two bodies;

operating between at least two different modes based on the relative velocity;

populating a lookup table based on a plurality of samples of the encoder signal obtained over a known distance;

in a first of the at least two modes, determining an indication of relative position between the two bodies based on position data stored in the lookup table;

in a second of the at least two modes, determining an indication of relative position between the two bodies based on the relative velocity between the two bodies.

23. The method of claim 22, further comprising predicting an indication of relative position between the two bodies when in the first of the at least two modes.

24. The method of claim 23, further comprising comparing the determined indication of relative position and the predicted position when the first of the at least two modes and employing the results of the comparison to adjust a stored position value for use in a subsequent prediction of relative position in the first of the at least two modes.

25. The method of claim 22, further comprising, interpolating between data stored in the lookup table to determine the indication of relative position when in the first of the at least two modes.

26. The method of claim 22, further comprising detecting zero crossings based on the encoder signal, the lookup table mapping a plurality of incremental positions between an adjacent pair of zero crossings.

27. The method of claim 26, further comprising counting a number of counts between zero crossings, the relative velocity being functionally related to the number of counts between zero crossings.

28. The method of claim 22, further comprising operating in the first of the at least two modes when the relative velocity is less than a first threshold and operating in the second of the at least two modes when the relative velocity is greater than a second threshold.

29. The method of claim 22, the encoder signal further comprising at least two digitized encoder signals having a generally quadrature relationship.

30. The method of claim 29, the population table being populated with incremental position data for a plurality of samples of the at least two encoder signals that occur over a known distance.

31. The method of claim 30, further comprising detecting zero crossings based on the at least two encoder signals, the known distance occurring between spaced apart positions that result in the respective zero crossings.

32. The method of claim 31, the lookup table defining a lissajous based on the ratio of the at least two encoder signals for the plurality of samples that occur between a pair of zero crossings, selected points along the lissajous mapping to incremental positions over the known distance.

33. The method of claim 32, further comprising computing an angle based on a ratio of the at least two encoder signals and determining a quadrant based on the relative values of the at least two encoder signals, the computed angle and quadrant mapping to a point along the lissajous that corresponds to an incremental position over the known distance.

34. The method of claim 22, further comprising dynamically adjusting at least one of gain and offset to correct respective amplitude and offset of the encoder signal.

35. A digital signal processor programmed to perform a method for improving resolution of an encoder that provides an encoder signal indicative of relative motion between two bodies, the method comprising:

determining an indication of a relative velocity between the two bodies;

operating between at least two different modes based on the relative velocity;

populating a lookup table based on a plurality of samples of the encoder signal obtained over a known distance;

in a first of the at least two modes, determining an indication of relative position between the two bodies based on position data stored in the lookup table;

in a second of the at least two modes, determining an indication of relative position between the two bodies based on the relative velocity between the two bodies.

* * * * *